(12) United States Patent  
Kumagai

(10) Patent No.: US 8,188,776 B2
(45) Date of Patent: May 29, 2012

(54) PHASE-LOCKED LOOP CIRCUIT

(75) Inventor: Akira Kumagai, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 7 days.

(21) Appl. No.: 12/850,907

(22) Filed: Aug. 5, 2010

(65) Prior Publication Data

US 2011/0032012 A1 Feb. 10, 2011

(30) Foreign Application Priority Data

Aug. 10, 2009 (JP) ................... 2009-185800

(51) Int. Cl.
*H03L 7/06* (2006.01)
(52) U.S. Cl. ........................................ 327/156; 327/159
(58) Field of Classification Search .................. 327/159, 327/150, 156, 117
See application file for complete search history.

(56) References Cited

U.S. PATENT DOCUMENTS

| | | | | |
|---|---|---|---|---|
| 5,907,253 A * | 5/1999 | Davis et al. | ................... | 327/156 |
| 6,801,591 B1 * | 10/2004 | Frencken | ................... | 375/373 |
| 7,015,763 B1 * | 3/2006 | Hallivuori et al. | ................... | 331/11 |
| 7,612,591 B2 * | 11/2009 | Kim | ................... | 327/158 |
| 2008/0197897 A1 * | 8/2008 | Iwaida et al. | ................... | 327/157 |
| 2010/0214031 A1 * | 8/2010 | Yamamoto et al. | ................... | 331/34 |
| 2011/0019767 A1 * | 1/2011 | Lamanna et al. | ................... | 375/295 |
| 2011/0084768 A1 * | 4/2011 | Hammond et al. | ................... | 331/18 |

FOREIGN PATENT DOCUMENTS

| | | |
|---|---|---|
| JP | 5-129948 A | 5/1993 |
| JP | 2000-031819 A | 1/2000 |

* cited by examiner

*Primary Examiner* — Ryan Jager
(74) *Attorney, Agent, or Firm* — Fujitsu Patent Center

(57) ABSTRACT

A phase-locked loop circuit includes a control loop including a frequency divider configured to frequency-divide an output clock and to control a frequency of the output clock according to a phase difference between a local clock and a phase-divided local clock; and a control unit configured to control a frequency dividing ratio of the frequency divider according to a phase difference between the output clock and an input clock that corresponds to data taken in based on the output clock.

9 Claims, 6 Drawing Sheets

PHASE-LOCKED LOOP CIRCUIT

CROSS-REFERENCE TO RELATED APPLICATION

This application is based upon and claims the benefit of priority of the prior Japanese Patent Application No. 2009-185800, filed on Aug. 10, 2009, the entire contents of which are incorporated herein by reference.

FIELD

The present disclosure generally relates to a phase-locked loop circuit.

BACKGROUND

A clock synchronization circuit is known that outputs a clock signal in synchronization with an input clock signal. For example, a clock synchronization circuit is known that includes a frequency divider to perform frequency-divide operation with a certain frequency dividing ratio that may be changed for an input auxiliary clock signal, a phase synchronization loop circuit that operates based on a frequency-division clock signal that is output from the frequency divider, and a frequency dividing ratio control unit to which a certain reference clock signal is input and determines a frequency dividing ratio of a frequency divider to a certain fixed value when a phase difference between a reference clock signal and a frequency division clock signal is within a certain range (for example, refer to Japanese Laid-open Patent Publication No. 2000-31819).

A PLL circuit is known that includes a VCXO oscillator circuit, a first frequency-dividing circuit that receives an output of the VCXO oscillator circuit, a second frequency-dividing circuit that receives a reference clock from an external source, a phase comparator circuit that receives an output of the first frequency-dividing circuit and the second frequency-dividing circuit, and a filter circuit that receives an output of the phase comparator circuit and outputs a certain control voltage for the VCXO oscillator circuit.

The PLL circuit may include, for example, a gate circuit that operates as required at an input stage of the first frequency-dividing circuit, a sample/hold circuit provided between the filter circuit and the VCXO oscillator circuit, a clock interruption detection circuit that detects an interrupted state immediately when a reference clock received from the external source is interrupted, and a control circuit that controls driving of the gate circuit and the sample/hold circuit according to an output signal from the clock interruption detection circuit (for example, Japanese Laid-open Patent Publication No. 05-129948)

SUMMARY

According to an aspect of the embodiment, a phase-locked loop circuit includes a control loop including a frequency divider configured to frequency-divide an output clock and to control a frequency of the output clock according to a phase difference between a local clock and a phase-divided local clock; and a control unit configured to control a frequency dividing ratio of the frequency divider according to a phase difference between the output clock and an input clock that corresponds to data taken in based on the output clock.

According to another aspect of the embodiment, a phase-locked loop circuit includes a first phase comparator configured to compare a phase of a local clock signal with a phase of a first clock signal and to output a signal according to a comparison result; a voltage-controlled oscillator configured to output an output clock signal with a frequency according to a voltage of the signal that is output from the first phase comparator; a first frequency divider configured to frequency-divide an output clock signal that is output from the voltage-controlled oscillator and to output the frequency-divided output signal to the first phase comparator as the first clock signal; a second phase comparator configured to compare a phase of an input clock signal with an output clock signal that is output from the voltage-controlled oscillator; and a control unit configured to control a phase-dividing ratio of the first frequency divider according to a signal that is output from the second phase comparator.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

Figure 1:
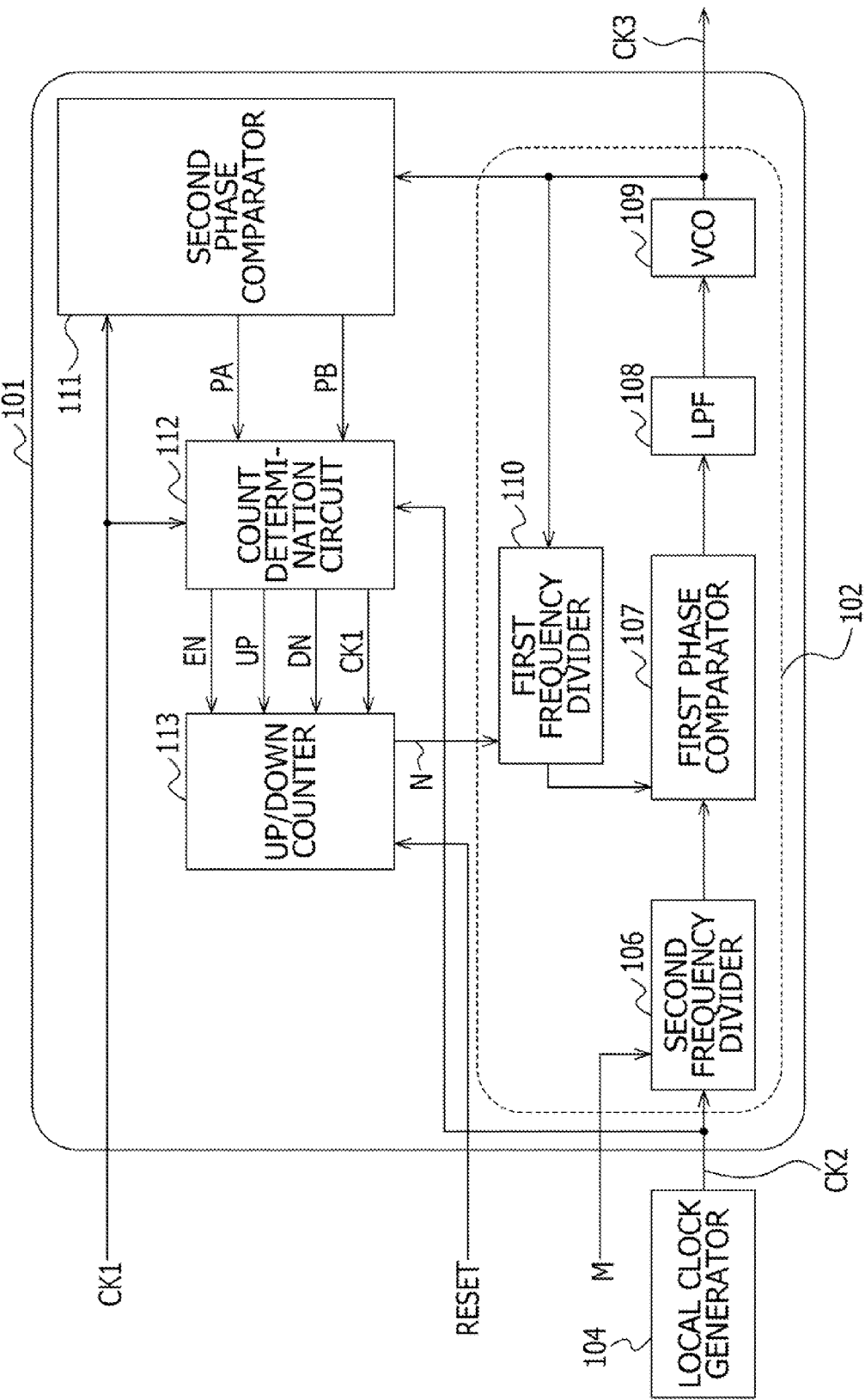
FIG. 1 is a block diagram illustrating one example of a phase-locked loop (PLL) circuit according to a first embodiment.

FIG. 1 is a block diagram illustrating one example of a phase-locked loop (PLL) circuit according to a first embodiment. A PLL circuit 101 includes a PLL circuit 102, a second phase comparator 111, a count determination circuit 112, and an up/down counter 113. The PLL circuit 102 includes a second frequency divider 106, a first phase comparator 107, a low-pass filter (LPF) 108, a voltage-controlled oscillator (VCO) 109, and a first frequency divider 110. A local clock generator 104 includes, for example, a crystal oscillator and generates a local clock signal CK2. The PLL circuit 101 receives an input clock signal CK1 from an external source and may output an output clock signal CK3 with substantially the same frequency as that of the input clock signal CK1 and in synchronization with the local clock signal CK2. Even if the input clock signal is interrupted, the PLL circuit 101 may continue to output the output clock signal CK3 with substantially the same frequency as that of the input signal CK1 before the interruption. For example, the local clock signal CK2 may be 10 MHz, and the input clock signal CK1 and the output clock signal CK3 may be 100 MHz.

A second frequency divider 106 frequency-divides the local clock signal CK2 by a frequency dividing ratio M and outputs the frequency-divided local clock signal to the first phase comparator 107. The frequency dividing ratio M is determined, for example, by a micro processor. For example, the second frequency divider 106 receives a 10 MHz local clock signal CK2 and outputs a 1 kHz local clock signal. The first phase comparator 107 includes, for example, an exclusive OR (XOR) circuit and compares a phase of a divided local clock signal that is output from the second frequency divider 106 with a phase of a first clock signal that is output from the first frequency divider 110 and outputs a comparison signal according to the comparison result. The low-pass filter 108 passes a low frequency band component of the comparison signal that is output from the first phase comparator 107, attenuates a high frequency band component of the comparison signal, and outputs a filtered signal to the voltage-controlled oscillator (VCO) 109. The VCO 109 outputs an output clock signal CK3 with a frequency according to a voltage of a signal that is output from the low-pass filter 108. The first frequency divider 110 frequency-divides the output clock signal CK3 output from the VCO 109 with a frequency-dividing ratio N and outputs the frequency-divided output clock signal to the first phase comparator 107 as the first clock signal. Feedback control is applied to the phase-locked loop circuit 102 so that a phase of the first clock signal that is output from the first frequency divider 110 and a phase of the divided local clock signal that is output from the second frequency divider 106 become substantially the same. The phase-locked loop circuit 102 outputs the output clock signal CK3. The output clock signal CK3 is a signal obtained by multiplying the local clock signal CK2 with a multiplication rate N/M.

The second phase comparator 111 includes, for example, an exclusive or (XOR) circuit and compares a phase of an input clock signal CK1 with a phase of an output clock signal CK3 that is output from the VCO 109, and outputs phase signals PA and PB according to the comparison result. For example, the phase signal PA becomes a high level when a frequency of the output clock signal CK3 is lower than a frequency of the input clock signal CK1, and the phase signal PB becomes a high level when a frequency of the output clock signal CK3 is higher than the frequency of the input clock signal CK1. A control unit includes the count determination circuit 112 and the up/down counter 113, and controls a frequency-dividing ratio N of the first frequency divider 110 according to the phase signals PA and PB that are output from the second phase comparator 111. The control unit controls, for example, the frequency-dividing ratio N so that frequencies of the input clock signal CK1 and the output clock signal CK3 become substantially the same.

The count determination circuit 112 receives the input clock signal CK1 and the local clock signal CK2 and according to phase signals PA and PB, outputs a frequency up signal UP, a frequency down signal DN, an enable signal EN, and an input clock signal CK1 to the up/down counter 113. For example, the phase signal PA becomes a high-level when a frequency of the output clock signal CK3 is lower than a frequency of the input clock signal CK1 and the frequency up signal UP becomes a high level. The phase signal PB becomes a high-level when a frequency of the output clock signal CK3 is higher than a frequency of the input clock signal CK1 and the frequency down signal DN becomes a high level. The enable signal EN becomes a high-level when the frequency up signal UP or the frequency down signal DN is a high-level.

The up/down counter 113 receives the input clock signal CK1 and the local clock signal CK2 and increments or decrements a count value based on the enable signal EN, the frequency up signal UP, and the frequency down signal DN to determine a frequency dividing ratio N of the first frequency divider 110. The up/down counter 113 is reset by a reset signal RESET.

Figure 2:
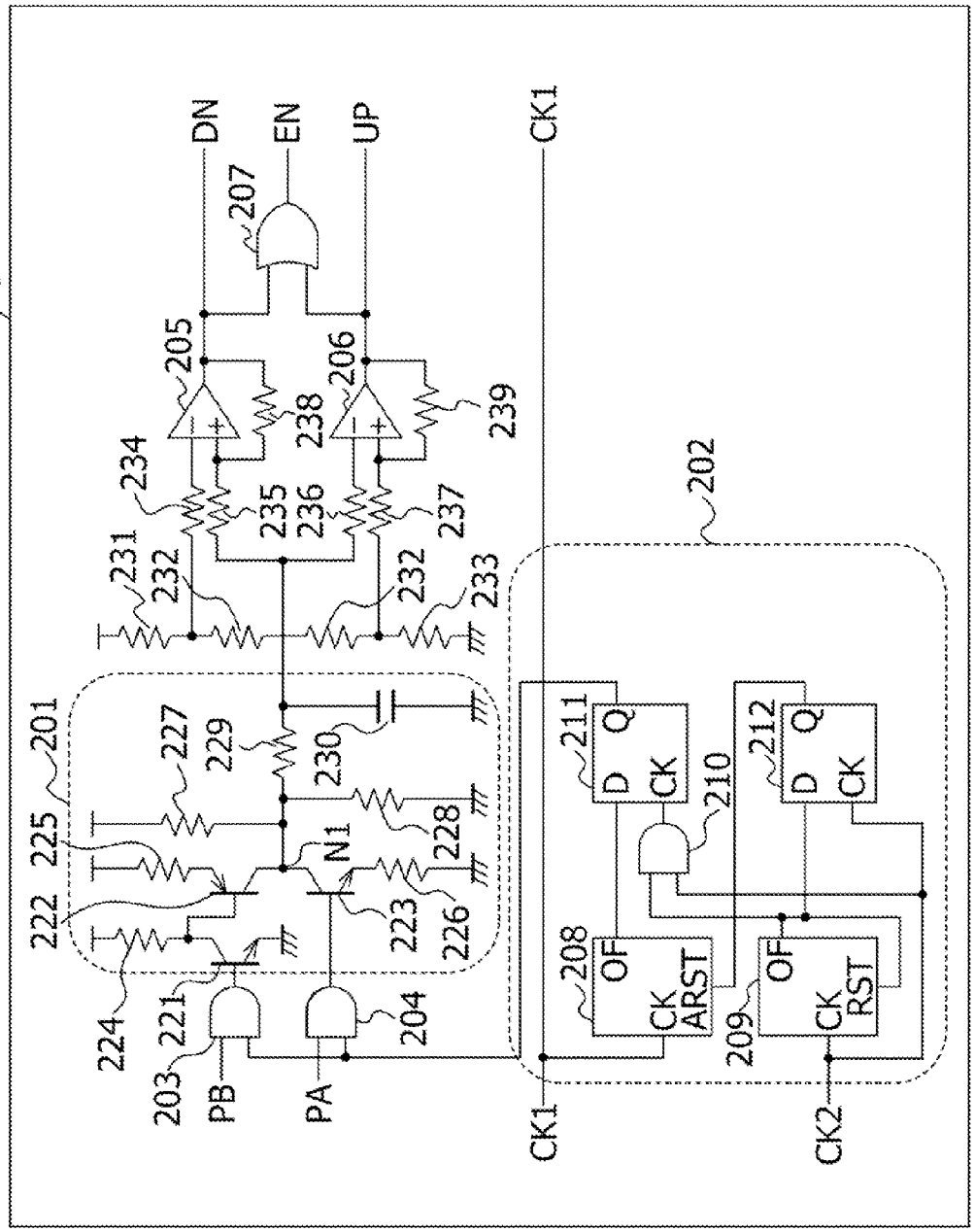
FIG. 2 illustrates one example of a count determination circuit in FIG. 1.

FIG. 2 illustrates one example of the count determination circuit 112 in FIG. 1. The count determination circuit 112 includes a difference circuit 201 and an input clock interruption detection circuit 202. The input clock interruption detection circuit 202 includes counters 208, and 209, an AND circuit 210, and D flip-flop circuits 211 and 212.

The counter 209 counts the number of pulses of the local clock signal CK2, and causes an overflow signal OF to transition to a high level when the number exceeds a setting value (for example, 16). When the overflow signal OF becomes a high-level, the counter 209 substantially synchronously resets the count value. The D flip-flop circuit 212 substantially synchronizes with the local clock signal CK2, maintains the overflow signal OF of the counter 209 and outputs a signal from an output terminal Q. The D flip-flop circuit 212 is a circuit that delays the overflow signal OF of the counter 209 for one clock cycle. The counter 208 counts the number of pulses of the input clock signal CK1 and causes an overflow signal OF to transition to a high-level when the number exceeds a setting value (for example, 3). The counter 208 asynchronously resets the count value when the output terminal Q of the D flip-flop circuit 212 becomes a high-level. The AND circuit 210 outputs an AND signal of the overflow signal OF of the counter 209 and the local clock signal CK2. The D flip-flop circuit 211 substantially synchronizes with an output signal of the AND circuit 210, maintains the overflow signal OF of the counter 208, and outputs the overflow signal OF from the output terminal Q.

The input clock interruption detection circuit 202 detects an interruption of the input clock signal CK1. When pulses of the input clock signal CK1 are continuously generated, the overflow signal OF of the counter 208 becomes a high-level, thereby an output signal of the D flip-flop circuit 211 becomes a high level as well. In contrast, when the pulse of the input clock signal CK1 stops, the overflow signal OF of the counter 208 becomes a low level, thereby the output signal of the D flip-flop circuit 211 becomes a low level as well. The output terminal Q of the D flip-flop circuit 211 becomes a high-level unless the input clock signal CK1 is interrupted and becomes a low-level when the input clock signal CK1 is interrupted.

An AND circuit 203 outputs an AND signal of the phase signal PB and a signal of the output terminal Q of the D flip-flop circuit 211. An AND circuit 204 outputs an AND signal of the phase signal PA and a signal of the output terminal Q of the D flip-flop circuit 211. In an npn transistor 221, a base is coupled to an output terminal of the AND circuit 203 and a collector is coupled to a power supply potential node through a resistor 224, and an emitter is coupled to a reference potential node (ground potential node). In a pnp transistor 222, a base is coupled to a collector of the npn transistor 221 and an emitter is coupled to the power supply potential node through a resistor 225, and the collector is coupled to a node N1. In an npn transistor 223, a base is coupled to an output terminal of the AND circuit 204, a collector is coupled to the node N1, and an emitter is coupled to the reference potential node through a resistor 226. A resistor 227 is coupled between the power supply potential node and the node N1. A resistor 228 is coupled between the node N1 and the reference potential node. A resistor 229 is coupled between the node N1 and an upper electrode of a capacitance 230. A lower electrode of the capacitance 230 is coupled to the reference potential node.

Figure 3:
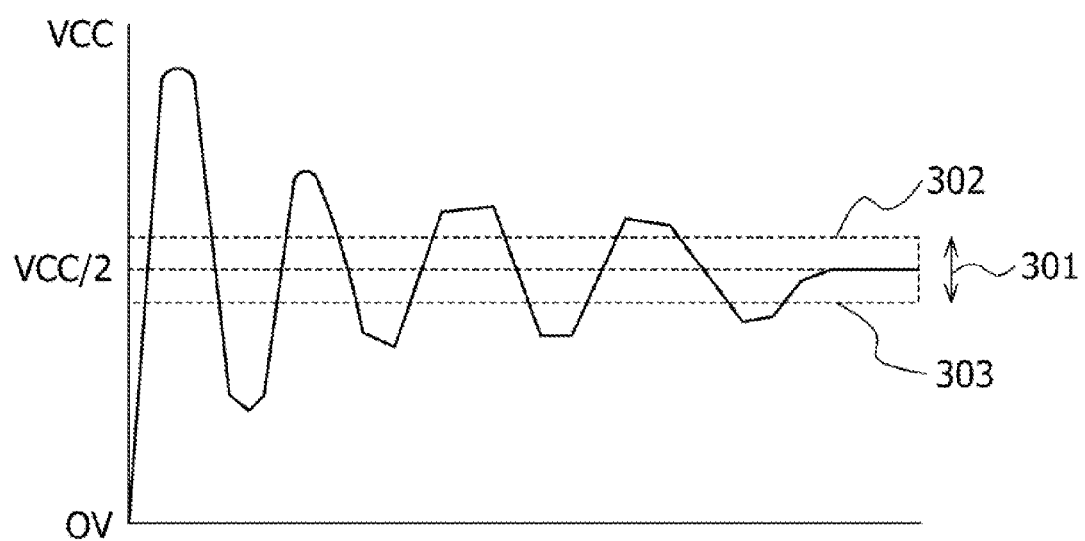
FIG. 3 is a time chart illustrating an output signal of a difference circuit.

FIG. 3 is a time chart illustrating an output signal of the difference circuit 201. An operation of the difference circuit 201 when the input clock signals CK1 are continuously generated and the output terminal Q of the D flip-flop circuit 211 becomes a high-level is described below.

The transistors 221 and 222 are turned on when the phase signal PB becomes a high-level and the phase signal PA becomes a low-level. A current flows into the capacitance 230 from the power supply potential node, thereby charges the capacitance 230, and the voltage rises toward the power supply voltage VCC. The capacitance 230 charges an integration voltage of the phase signal PB. Conversely, the transistors 221 and 222 are turned off and the transistor 223 is turned on when the phase signal PB becomes a low-level and the phase signal PA becomes a high-level. Accordingly, current flows into the reference potential node from the capacitance 230, the capacitance 230 discharges and the voltage decreases toward 0V. The capacitance 230 discharges the integration voltage of the phase signal PA. As a result, the capacitance 230 maintains a differential voltage between the integration voltage of the phase signal PB and that of the phase signal PA, and the difference circuit 201 outputs a voltage of the capacitance 230. By performing integration, an abrupt change of control of the frequency-dividing ratio N may be reduced, if not prevented. By applying feedback control of the PLL circuit 102, an output signal of the difference circuit 201 is converged to a VCC/2 and the output clock signal CK3 is converged to substantially the same frequency as that of the input clock signal CK1.

An operation of the difference circuit 201 when an input clock signal CK1 is interrupted and the output terminal Q of the D flip-flop circuit 211 becomes a low-level is described below.

When the output terminal Q of the D flip-flop circuit 211 becomes a low level, the transistors 221 to 223 are turned off. The node N1 changes toward an intermediate potential of idle potential VCC/2 by resistance division of the resistors 227 and 228, and settles to the idle potential VCC/2. For example, the node N1 becomes about 2.5 V when the power supply potential VCC is about 5 V and the reference potential node is about 0 V.

Resistors 231 to 233 are serially coupled between the power supply potential node and the reference potential node. A resistor 234 is coupled between an intercoupling point of the resistors 231 and 232 and a negative input terminal of an operational amplifier (comparator) 205. A resistor 235 is coupled between an upper electrode of the capacitance 230 and a positive input terminal of the operational amplifier 205. A resistor 238 is coupled between an output terminal and the positive input terminal of the operational amplifier 205. The operational amplifier 205 outputs a high-level frequency down signal DN when an output voltage of the difference circuit 201 is higher than a threshold voltage 302 (FIG. 3), while outputs a low-level frequency down signal DN when an output voltage of the difference circuit 201 is lower than the threshold voltage 302.

A resistor 237 is coupled between an intercoupling point of the resistors 232 and 233 and a positive input terminal of an operational amplifier 206. A resistor 236 is coupled between the upper electrode of the capacitance 230 and a negative input terminal of the operational amplifier 206. The resistor 239 is coupled between an output terminal and the positive input terminal of the operational amplifier 206. The operational amplifier 206 outputs a high-level frequency up signal UP when an output voltage of the difference circuit 201 is lower than a threshold voltage 303 (FIG. 3), while outputs a low-level frequency up signal UP when an output voltage of the difference circuit 201 is higher than the threshold voltage 303.

An OR circuit 207 outputs an OR signal of the frequency down signal DN and the frequency up signal UP as an enable signal EN. A potential between the threshold voltages 302 and 303 is an insensitive potential 301. The up/down counter 113 increments or decrements a count value based on the frequency up signal UP and the frequency down signal DN to determine a frequency dividing ratio N of the first frequency divider 110. When the frequency up signal UP becomes a high-level, the frequency dividing ratio N is increased, and a frequency of the output clock signal CK3 is increased. When the frequency down signal DN becomes a high-level, the frequency dividing ration N is decreased, and a frequency of the output clock signal CK3 is decreased. As illustrated in FIG. 3, by repeating the increase and decrease of the count value of the up/down counter 113, the frequency of the output clock signal CK3 comes close to the frequency of the input clock signal CK1, and settles around the frequency of the input clock signal CK1. When a power supply is turned on, a high-level frequency up signal UP is output. A potential of the capacitance 230 comes close to the idle potential VCC/2 when the phase signals PA and PB are at a low-level.

The input clock interruption detection circuit 202 measures the number of pulses of an input clock signal CK1 for a certain amount of time by the counter 208 and determines the input clock signal CK1 is interrupted when the count value is lower than a certain value, and stops an operation of the difference circuit 201 to make a potential of the capacitance 230 close to the idle potential VCC/2. Further, the input clock signal CK1 that is input to the up/down counter 113 stops upon interruption of the input clock signal CK1, and thereby the operation of the up/down counter 113 stops.

When the input clock signal CK1 is interrupted, the potential of the capacitance 230 becomes the idle potential VCC/2 and the frequency down signal DN and the frequency up signal UP become a low-level. As a result, the up/down counter 113 maintains a frequency dividing ratio N before the interruption of the input clock signal CK1, and maintains the frequency dividing ratio N of the first frequency divider 110. When the input clock interruption circuit 202 detects an interruption of the input clock signal CK1, the up/down counter 113 maintains the frequency dividing ratio N before the interruption of the input clock signal CK1 and controls the first frequency divider 110 so that frequency-division is performed with the maintained frequency dividing ratio N.

As described above, even for an application in which a frequency of an input clock signal CK1 is unknown, a clock signal obtained by frequency-dividing a local clock signal CK2 with a frequency dividing ratio M is assumed to be a base frequency and outputs an output clock signal CK3 that is obtained by multiplying the local clock signal CK2 as a multiplication rate N/M. By multiplying the base frequency as a frequency unit (for example, 1 kHz, 100 kHz, or 1 MHz etc.), output clock signals CK3 with various frequencies may be output. Where there is a subtle difference between a desired frequency of an LSI and an input clock signal CK1 that is actually input, the difference is corrected by a clock signal with the base frequency generated from the local clock signal CK2 and quality of the output clock signal CK3 is improved.

Using a crystal oscillator with a high oscillation frequency as a local clock generator 104 to make a frequency of the local clock signal CK2 high increases radiation noise, thereby increases power consumption. According to the embodiment, even when a frequency of the local clock signal CK2 is low, by controlling a frequency dividing ratio N, an output clock signal CK3 with a high frequency may be generated.

Second Embodiment

Figure 4:
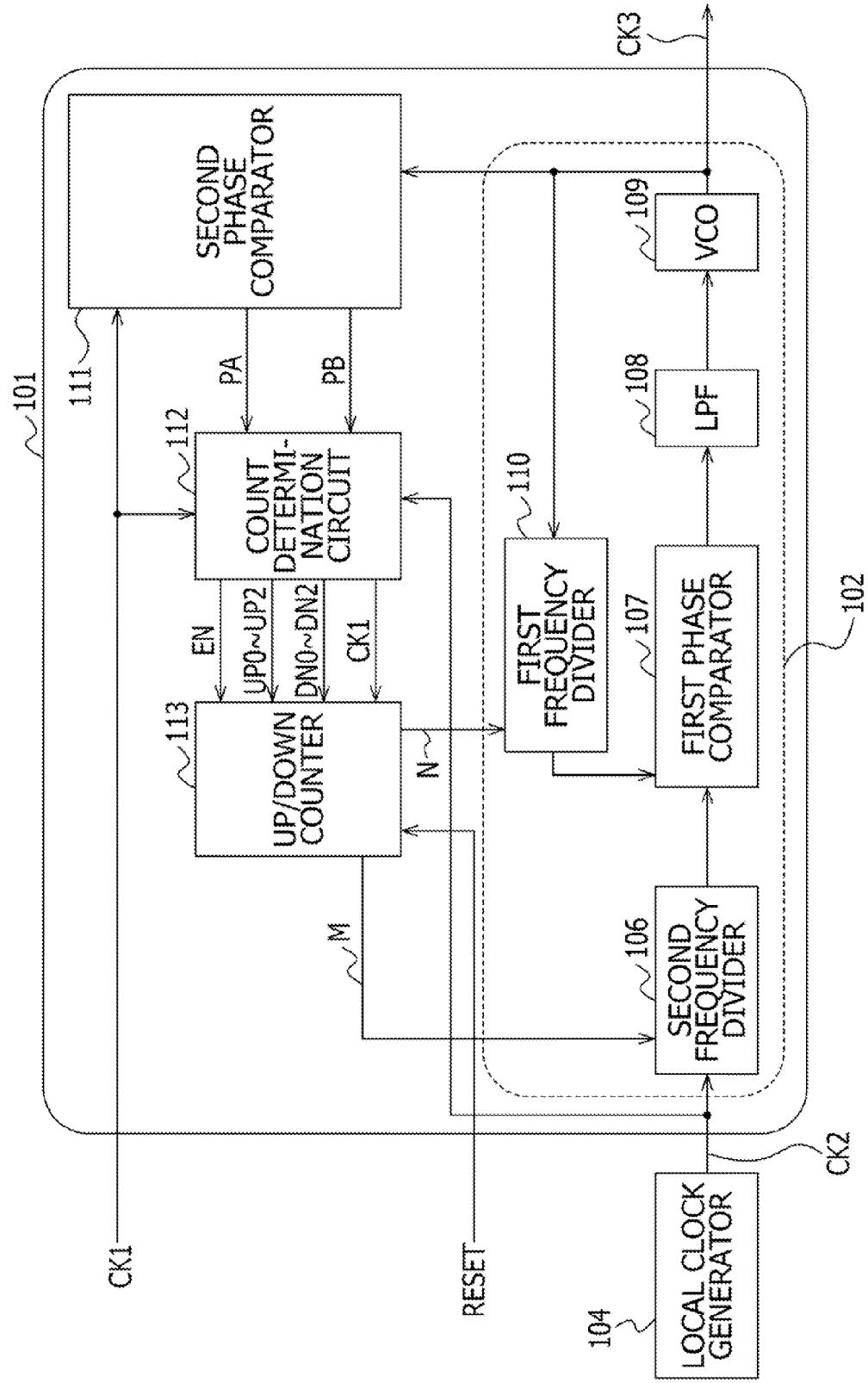
FIG. 4 is a block diagram illustrating one example of a phase-locked loop circuit according to a second embodiment.

FIG. 4 is a block diagram illustrating one example of a phase-locked loop circuit according to a second embodiment.

The second embodiment differs from the first embodiment, in that a frequency dividing ratio M of a second frequency divider 106 is controlled by the up/down counter 113. Hereinafter, points that are different from those of the first embodiment will be described. A count determination circuit 112 outputs 3-bit frequency up signals UP0 to UP2 and 3-bit frequency down signals DN0 to DN2 to the up/down counter 113. The up/down counter 113 controls a frequency dividing ratio N of a first frequency divider 110 and a frequency dividing ratio M of a second frequency divider 106 based on the 3-bit frequency up signals UP0 to UP2 and 3-bit frequency down signals DN0 to DN2.

Figure 5:
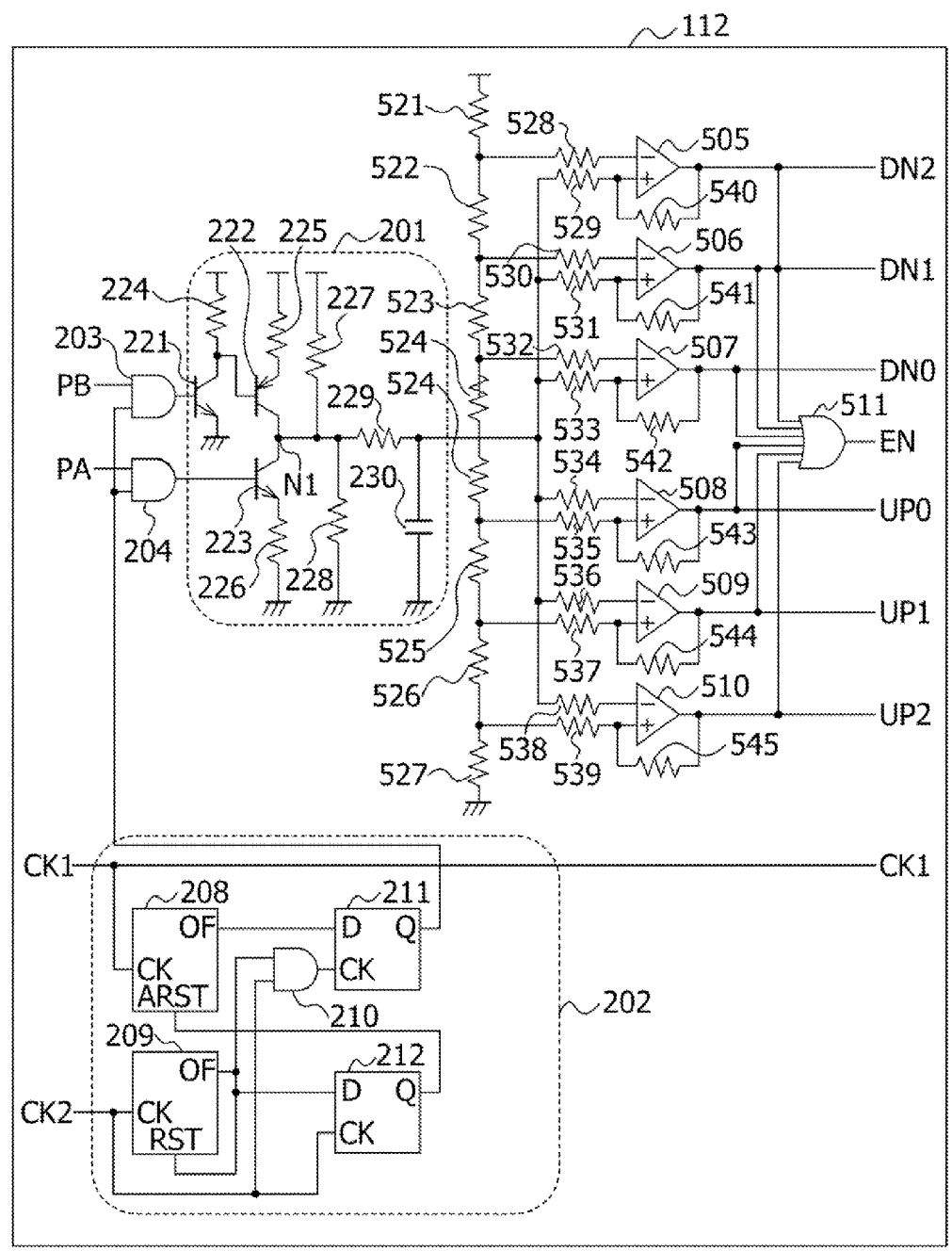
FIG. 5 is a circuit diagram illustrating one example of the count determination circuit.
Figure 6:
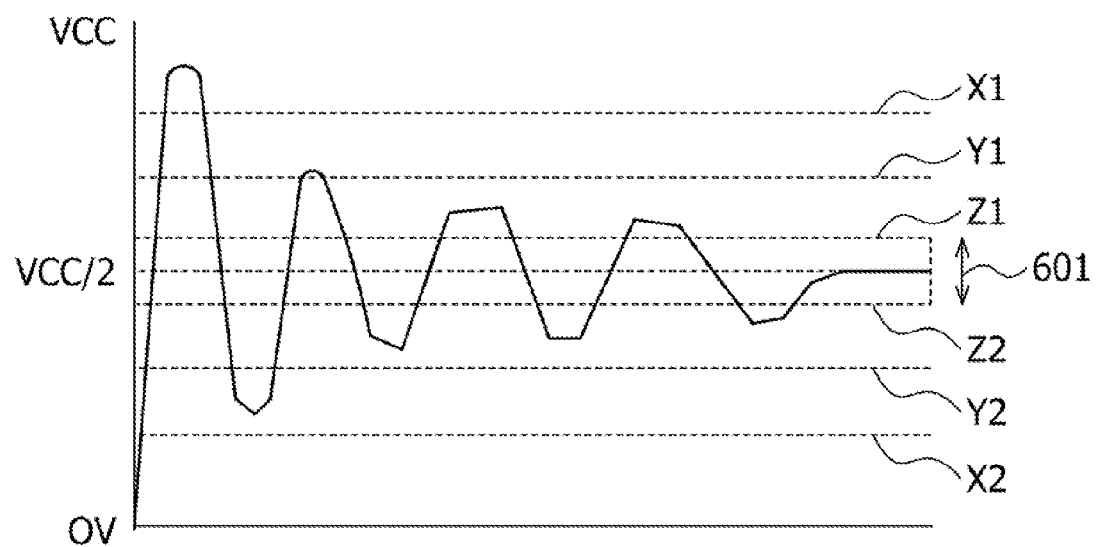
FIG. 6 is a time chart illustrating an output signal of the difference circuit.

FIG. 5 is a circuit diagram illustrating one example of the count determination circuit 112 in FIG. 4. FIG. 6 is a time chart illustrating an output signal of the difference circuit 201. FIG. 5 as compared with FIG. 2, a circuit of a latter stage of the difference circuit 201 differs. Hereinafter, points of FIG. 5 that are different from those of FIG. 2 are described. Resistors 521 to 527 are serially coupled between a power supply potential node and a reference potential node.

A resistor 528 is coupled between an intercoupling point of the resistors 521 and 522 and a negative input terminal of an operational amplifier (comparator) 505. The resistor 529 is coupled between the upper electrode of a capacitance 230 and a positive input terminal of the operational amplifier 505. A resistor 540 is coupled between an output terminal and the positive input terminal of the operational amplifier 505. The operational amplifier 505 outputs a high-level frequency down signal DN2 when an output voltage of the difference circuit 201 is higher than a threshold voltage X1 (FIG. 6), while outputs a low-level frequency down signal DN2 when an output voltage of the difference circuit 201 is lower than the threshold voltage X1.

A resistor 530 is coupled between an intercoupling point of the resistors 522 and 523 and a negative input terminal of an operational amplifier 506. A resistor 531 is coupled between an upper electrode of the capacitance 230 and a positive input terminal of the operational amplifier 506. The resistor 541 is coupled between an output terminal and the positive input terminal of the operational amplifier 506. The operational amplifier 506 outputs a high-level frequency down signal DN1 when an output voltage of the difference circuit 201 is higher than a threshold voltage Y1 (FIG. 6), while outputs a low-level frequency down signal DN1 when an output voltage of the difference circuit 201 is lower than the threshold voltage Y1.

A resistor 532 is coupled between an intercoupling point of the resistors 523 and 524 and a negative input terminal of an operational amplifier 507. A resistor 533 is coupled between an upper electrode of the capacitance 230 and a positive input terminal of the operational amplifier 507. A resistor 542 is coupled between an output terminal and the positive input terminal of the operational amplifier 507. The operational amplifier 507 outputs a high-level frequency down signal DN0 when an output voltage of the difference circuit 201 is higher than a threshold voltage Z1 (FIG. 6), while outputs a low-level frequency down signal DN0 when an output voltage of the difference circuit 201 is lower than the threshold voltage Z1.

A resistor 535 is coupled between an intercoupling point of the resistors 524 and 525 and a positive input terminal of an operational amplifier 508. A resistor 534 is coupled between an upper electrode of the capacitance 230 and a negative input terminal of the operational amplifier 508. A resistor 543 is coupled between an output terminal and the positive input terminal of the operational amplifier 508. The operational amplifier 508 outputs a high-level frequency up signal UP0 when an output voltage of the difference circuit 201 is lower than a threshold voltage Z2 (FIG. 6), while outputs a low-level frequency up signal UP0 when an output voltage of the difference circuit 201 is higher than the threshold voltage Z2.

A resistor 537 is coupled between an intercoupling point of the resistors 525 and 526 and a positive input terminal of an operational amplifier 509. A resistor 536 is coupled between an upper electrode of the capacitance 230 and a negative input terminal of the operational amplifier 509. A resistor 544 is coupled between an output terminal and a positive input terminal of the operational amplifier 509. The operational amplifier 509 outputs a high-level frequency up signal UP1 when an output voltage of the difference circuit 201 is lower than a threshold voltage Y2 (FIG. 6), while outputs a low-level frequency up signal UP1 when an output voltage of the difference circuit 201 is higher than the threshold voltage Y2.

A resistor 539 is coupled between an intercoupling point of the resistors 526 and 527 and a positive input terminal of an operational amplifier 510. A resistor 538 is coupled between an upper electrode of the capacitance 230 and a negative input terminal of the operational amplifier 510. A resistor 545 is coupled between an output terminal and a positive input terminal of the operational amplifier 510. The operational amplifier 510 outputs a high-level frequency up signal UP2 when an output voltage of the difference circuit 201 is lower than a threshold voltage X2 (FIG. 6), while outputs a low-level frequency up signal UP2 when an output voltage of the difference circuit 201 is higher than the threshold voltage X2.

An OR circuit 511 outputs an OR signal of the frequency down signals DN0 to DN2 and the frequency up signals UP0 to UP2 as an enable signal EN. A potential between the threshold voltages Z1 and Z2 is an insensitive potential 601.

The frequency up signals UP0 to UP2 and the frequency down signals DN0 to DN2 indicate a magnitude of a difference value between an output potential of the difference circuit 201 and an idle potential VCC/2.

When an output voltage of the difference circuit 201 is the threshold voltage X1 or higher, the frequency down signals, DN0, DN1, and DN2 and the enable signal EN become a high-level. The up/down counter 113 changes a frequency dividing ratio M to M−1 and a frequency dividing ratio N to (N−N/M)−1. In other words, the frequency dividing ratio N is counted down after making the frequency dividing ratio N dominant. Accordingly, the multiplication rate N/M of the output clock signal CK3 may be reduced at substantially maximum width.

When an output voltage of the difference circuit 201 is between the threshold voltages Y1 and Z1, the frequency down signal DN0 and the enable signal EN become a high-level. The up/down counter 113 changes the frequency dividing ratio M to M+1 and the frequency dividing ratio N to (N+N/M)−1. In other words, the frequency dividing ratio N is counted down after making the frequency dividing ratio N non-dominant. Accordingly, the multiplication rate N/M of the output clock signal CK3 may be reduced at substantially minimum width.

When an output voltage of the difference circuit 201 is between the threshold voltages X1 and Y1, the frequency down signals DN0 and DN1 and the enable signal EN become a high-level. The up/down counter 113 changes the frequency dividing ratio N to N−1 without changing a magnitude of the frequency dividing ratio M. Accordingly, the multiplication rate N/M of the output clock signal CK3 may be reduced at substantially medium width.

When an output voltage of the difference circuit 201 is lower than the threshold voltage X2, the frequency up signals, UP0, UP1, and UP2 and the enable signal EN become a high-level. The up/down counter 113 changes the frequency dividing ratio M to M−1 and the frequency dividing ratio N to (N−N/M)+1. In other words, the frequency dividing ratio N is counted up after making the frequency dividing ratio N dominant. Accordingly, the multiplication rate N/M of the output clock signal CK3 may be increased at substantially maximum width.

When an output voltage of the difference circuit 201 is between the threshold voltages Y2 and Z2, the frequency up signal UP0 and the enable signal EN become a high-level. The up/down counter 113 changes the frequency dividing ratio M to M+1 and frequency dividing ratio N to (N+N/M)+1. In other words, the frequency dividing ratio N is counted up after making the frequency dividing ratio N non-dominant. Accordingly, the multiplication rate N/M of the output clock signal CK3 may be increased at substantially minimum width.

When an output voltage of the difference circuit 201 is between threshold voltages X2 and Y2, the frequency up signals UP0 and UP1 and the enable signal EN become a high-level. The up/down counter 113 changes the frequency dividing ratio N to N+1 without changing a magnitude of the frequency dividing ratio M. Accordingly, the multiplication rate N/M of the output clock signal CK3 may be increased at substantially medium width.

The up/down counter 113 controls the frequency dividing ratio N of the first frequency divider 110 and the frequency dividing ratio M of the second frequency divider 106 according to the signals UP0 to UP2, and DN0 to DN2 that are output from the count determination circuit 112.

When the input clock interruption circuit 202 detects an interruption of the input clock signal CK1, the up/down counter 113 maintains the frequency dividing ratio N of the first frequency divider 110, and the frequency dividing ratio M of the second frequency divider 106 before the interruption of the input clock signal CK1. The up/down counter 113 controls the first frequency divider 110 and the second frequency divider 106 so that frequency-division is performed with the maintained frequency dividing ratios N and M.

As described above, operation is performed so that a frequency of the output clock signal CK3 stays within a certain range for the input clock signal CK1. Upon interruption of the input clock signal CK1, the frequency dividing ratios N and M are fixed to hold the frequency of the output clock signal CK3. A denominator of the multiplication rate N/M of the output clock signal CK3 is also controlled, thus, the frequency of the output clock signal CK3 comes substantially close or identical to the frequency of the input clock signal CK1.

As illustrated in FIG. 6, a relationship of the threshold voltages is expressed as: X2<Y2<Z2<Z1<Y1<X1. Hysteresis characteristics may be given to each of the threshold voltages. Finer control of the numerator and denominator of the multiplication rate N/M may be achieved by increasing the number of threshold voltages.

A variable amount of the multiplication rate N/M is controlled based on a magnitude of phase difference between the output clock signal CK3 and the input clock signal CK1 obtained by the phase comparator 111. When the magnitude of phase difference is large, the multiplication rate N/M is substantially changed. When the magnitude of phase difference is small, the multiplication rate N/M is modestly changed.

A part of the count determination circuit 112 according to the first and second embodiments is illustrated as the analog circuit; however, for example, all of the count determination circuit 112 may be configured with digital circuits.

According to the first and second embodiments, substantially the same frequency is maintained even when environmental conditions are changed with time. This is because the output clock signal CK3 with a frequency close to the frequency of the input clock signal CK1 is output and the clock signal generation method based on the frequency dividing ratio is applied.

After reaching a certain frequency, in order to be less affected by jitter and noise, frequency stability may be improved by giving hysteresis characteristics to a frequency dividing ratio change detection level, and by not changing the frequency dividing ratio in response to a small change. When the frequency of the input clock signal CK1 is changed in the midway, the second phase comparator 111 detects a phase difference between the current output clock signal CK3 and the input clock signal CK1 and changes the frequency of the current output clock signal CK3 by varying the frequency dividing ratio so that the frequency of the output clock signal CK3 is in a certain range for the input clock signal CK1.

When the input clock signal CK1 is interrupted, the interruption is determined, the frequency dividing ratio is fixed and the output clock signal CK3 with the frequency before the interruption is maintained and output. A change amount of the frequency dividing ratio is set to be small when the input clock signal CK1 is interrupted. The input clock signal CK1 restarts with the small change amount of the frequency dividing ratio after the fixing of the frequency dividing ratio is released. Accordingly, even if phases of the input clock signal CK1 changes before and after the interruption, glitch noise and discontinuous clocks may not be generated for the resynchronized output clock signal CK3. Even if a frequency of the input clock signal CK1 is changed before and after the interruption of the input clock signal CK1, the frequency of the input clock signal CK1 may be followed without interrupting the output clock signal CK3.

Note that a voltage for the entire system is about 0 V when turning on the power. Regarding a variable amount of a control voltage of the frequency dividing ratio, 0 V is assigned as a substantially maximum frequency up control amount. The frequency up control amount is decreased as the voltage gradually increases. A medium potential between the power supply potential VCC and 0 V is assumed to be an idle potential. Accordingly, rising characteristics of a frequency at an initial stage of power on may be improved and a speed to reach a target frequency may be improved.

An interruption of the input clock signal CK1 is determined by using the counter 208 that counts the number of pulses of the input clock signal CK1 and the counter 209 that counts the number of pulses of the local clock signal. The number of pulses of the input clock signal CK1 is counted by the counter 208 while the count value of the counter 209 is incremented from 0 to a specified count value. For example, the input clock signal CK1 is determined to be continued (not interrupted) when the count value of the counter 208 is the specified count value or more. The input clock signal CK1 is determined to be interrupted when the count value of the counter 208 is smaller than the specified count value, and the determination result is latched until a subsequent measurement period ends.

A variable amount of the frequency dividing ratio is controlled by the second phase comparator 111 based on the phase difference between the output clock signal CK3 and the input clock signal CK1 so that an output clock signal CK3 with a frequency close to the frequency of the input clock signal CK1 is output. Upon an interruption of the input clock signal CK1, varying the frequency dividing ratio is stopped to fix the frequency dividing ratio, thereby the frequency of the output clock signal CK3 may be maintained substantially constant even if a voltage and temperature may be changed.

Substantial change of the frequency dividing ratio upon restarting the input clock signal CK1 may be reduced, if not prevented, by reducing a control amount of the frequency dividing ratio during the interruption of the input clock signal CK1 and glitch noise and discontinuous clock generation may be reduced, if not prevented, by setting a change amount to be small.

The voltage for the entire system is about 0 V when turning on the power, thereby a variable amount of the frequency dividing ratio for frequency up control is changed at substantially maximum amount and rising of a frequency at the power on is fast. Accordingly, a speed to reach a target frequency is improved. By determining the frequency dividing ratio of the local clock signal CK2 to a value that is obtained by multiplying a base frequency, selectivity of frequencies becomes high and when there is a subtle difference between a frequency that is desirable for an LSI and the input clock signal CK1 that is actually input, the difference is corrected by the generated clock signal with the base frequency.

According to the second embodiment, the frequency dividing ratios N and M may be controlled by including the frequency dividing ratio M of the local clock signal CK2 without determining the frequency dividing ratio of the local clock signal CK2 to a value obtained by multiplying a base frequency. The frequency of the output clock signal CK3 comes substantially close and/or identical to a level that is substantially equivalent to a frequency of the input clock signal CK1. Thus, a clock hold of a frequency with higher accuracy may be achieved.

Time from an interruption of the input clock signal CK1 to obtain a determination result is fixed because an interruption of the input clock signal CK1 is determined for each time unit without depending on the frequency of the input clock signal CK1. An interruption and continuation of the input clock signal CK1 may be quickly determined, because, in a circuit that integrates the phase signals PA and PB, an integral action coefficient that is less affected by time from the interruption to obtain the determination result may be set with a fixed coefficient without depending on the frequency of the input clock signal CK1.

According to the first and second embodiments, an output clock signal CK3 with a frequency that is close to the frequency of the input clock signal CK1 may be obtained regardless of the input clock signal CK1 that is input. The interruption and restart of the input clock signal CK1 may be detected quickly and a stable output clock signal CK3 may be continued even if the input clock signal CK1 is interrupted. The first and second embodiments withstand jitter and may suppress frequency change of the output clock signal CK3 due to change in environmental conditions etc. The output clock signal CK3 may not be discontinuous because the input clock signal CK1 is resynchronized when supply of the input clock signal CK1 is restarted. Even if the frequency of the input clock signal CK1 is changed when supply of the input clock signal CK1 is restarted, the output clock signal CK3 may follow the input clock signal CK1.

As described above, the output clock signal CK3 with good quality that satisfies LSI requirement specifications is obtained when the input clock signal CK1 is interrupted and restarted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A phase-locked loop circuit comprising:
   a first phase comparator configured to compare a phase of a local clock signal with a phase of a first clock signal and to output a signal according to a comparison result;
   a voltage-controlled oscillator configured to output an output clock signal with a frequency according to a voltage of the signal that is output from the first phase comparator;
   a first frequency divider configured to frequency-divide the output clock signal that is output from the voltage-controlled oscillator and to output the frequency-divided output signal to the first phase comparator as the first clock signal;
   a second phase comparator configured to compare a phase of an input clock signal with the output clock signal that is output from the voltage-controlled oscillator; and
   a control unit configured to control a frequency dividing ratio of the first frequency divider according to a signal that is output from the second phase comparator,
   wherein the control unit includes an input clock interruption detection unit that is configured to detect an interruption of the input clock signal, and
   wherein the input clock interruption detection unit is further configured, when the interruption of the input clock signal is detected, to maintain the frequency-dividing ratio of the first frequency divider before the interruption and to control the first divider so that frequency-dividing is applied with the maintained frequency-division ratio of the first frequency divider.

2. The phase-locked loop circuit according to claim 1, further comprising:
   a second frequency divider configured to frequency-divide the local clock signal and to output the frequency-divided local clock signal to the first phase comparator, wherein the first phase comparator compares a phase of the frequency-divided local clock signal with the phase of the first clock signal.

3. The phase-locked loop circuit according to claim 1, further comprising:
   a low-pass filter configured to pass a low frequency band component of the signal that is output from the first phase comparator, to attenuate a high frequency band component of the signal that is output from the first phase comparator, and to output to the filtered signal to the voltage-controlled oscillator.

4. The phase-locked loop circuit according to claim 2, wherein the first phase comparator outputs a signal according to a comparison result between the phase of the frequency-divided local clock signal with the phase of the first clock signal.

5. The phase-locked loop circuit according to claim 2, wherein the control unit controls the frequency-dividing ratio of the first frequency divider and a frequency-dividing ratio of the second frequency divider according to the signal that is output from the second phase comparator.

6. The phase-locked loop circuit according to claim 5, wherein the control unit includes the input clock interruption detection unit configured to detect the interruption of the input clock signal, and to maintain the frequency-dividing ratio of the first frequency divider and the frequency-dividing ratio of the second frequency divider before the interruption of the input clock signal when the interruption of the input clock signal is detected, to control the first frequency divider so that frequency-division is applied with the maintained frequency division ratio of the first frequency divider and to control the second frequency divider so that frequency-division is applied with the maintained frequency dividing ratio of the second frequency divider.

7. The phase-locked loop circuit according to claim 1, wherein the signal that is output from the second phase comparator is one of a high-level signal and a low level signal.

8. The phase-locked loop circuit according to claim 1, wherein:

the signal output from the second phase comparator is one of a first signal and a second signal output by the second phase comparator based on a comparison result between the phase of the input clock signal and the output clock signal that is output from the voltage-controlled oscillator;

the control unit includes a difference circuit configured to output a differential voltage between integration voltages of the first signal and the second signal that are output from the second phase comparator.

9. The phase-locked loop circuit according to claim 8, wherein the differential voltage that is output from the difference circuit converges to ½ of a power supply potential of the difference circuit.

\* \* \* \* \*